United States Patent
Horng et al.

(10) Patent No.: US 6,759,685 B2
(45) Date of Patent: Jul. 6, 2004

(54) HIGH-BRIGHTNESS LIGHT EMITTING DIODE

(75) Inventors: Ray-Hua Horng, Taichung (TW); Tung-Hsing Wu, Taichung (TW); Shao-Hua Huang, Ping-Chen (TW); Chih-Ru Chung, Chung-Li (TW); Juin-Jer Yang, Taipei (TW)

(73) Assignee: National Chung-Hsing University, Taichung (TW)

(*) Notice: Subject to any disclaimer, the term of this patent is extended or adjusted under 35 U.S.C. 154(b) by 0 days.

(21) Appl. No.: 10/259,915

(22) Filed: Sep. 30, 2002

(65) Prior Publication Data

US 2003/0085851 A1 May 8, 2003

(30) Foreign Application Priority Data

Nov. 7, 2001 (TW) .......................................... 90127823 A

(51) Int. Cl.[7] ............................................. H01L 29/26
(52) U.S. Cl. ......................................................... 257/79
(58) Field of Search ................................ 257/98, 99, 94, 257/96, 777; 438/118, 406, 455

(56) References Cited

U.S. PATENT DOCUMENTS

| 6,207,973 | B1 | * | 3/2001 | Sato et al. | 257/98 |
| 6,320,206 | B1 | * | 11/2001 | Coman et al. | 257/94 |
| 6,410,942 | B1 | * | 6/2002 | Thibeault et al. | 257/88 |
| 6,504,180 | B1 | * | 1/2003 | Heremans et al. | 257/98 |

* cited by examiner

Primary Examiner—Sara Crane
(74) Attorney, Agent, or Firm—Charles E. Baxley

(57) ABSTRACT

The present invention discloses a high-brightness light emitting diode (LED), which primarily includes a LED epitaxial layer with a reflective layer and a Si substrate with an adhesive layer. The LED epitaxial layer is bonded with the Si substrate by attaching the reflective layer and the adhesive layer. An n-type ohmic contact electrode and a p-type ohmic contact electrode are deposed on the front side of the LED. In the present invention, the reflective layer, the adhesive layer and the ohmic contact electrodes preferably perform single function, so that the most appropriate materials can be applied. Therefore, the LED of the present invention can exhibit excellent brightness.

15 Claims, 7 Drawing Sheets

HIGH-BRIGHTNESS LIGHT EMITTING DIODE

BACKGROUND OF THE INVENTION

1. Field of the Invention

The present invention relates to a light emitting diode and, more particularly, to a high-brightness light emitting diode including a reflective layer and an adhesive layer.

2. Description of Related Art

Currently, a trend of developing the light emitting diodes is to promote the brightness. In order to achieve this object, one or more reflective metal layers are combined therein. However, this metal layer has to also possess properties of adhesion and ohmic contact.

For example, R.O.C. Patent No. 369731 disclosed an LED in which the GaAs substrate is replaced with an Si substrate having a reflective metal layer thereon by wafer bonding technology. Unfortunately, such design cannot improve the lighting effect of short wavelengths.

Additionally, in U.S. Pat. No. 5,376,580, the GaAs substrate is a temporary substrate for epitaxying and then removed after being bonded to a transparent substrate. Though this method prevents absorption of the GaAs substrate, the processes have to be carried out at high temperature which might damage the structure and thus impact the lighting effect. Additionally, this transparent substrate is made by GaP which can absorb the short-wavelength light.

R.O.C. Patent No. 415116 mentioned a light emitting diode 10 as shown in FIG. 1, in which two reflective adhesive metal layers 16, 12 are respectively attached on the bottom surface of the LED epitaxial layer 15 and the top surface of the substrate 11. By bonding the two reflective adhesive metal layers 16, 12, the light beams can be propagated from the front side of the LED 10 and the brightness can be promoted.

FIG. 2 shows another conventional LED 20, in which a metal adhesive layer 22 is formed on a top surface of the $SiO_2$ substrate 21, and an LED epitaxial layer 25 is bonded to the top surface of the metal adhesive layer 22. Brightness of the LED 20 can be improved due to ohmic contact between the substrate 21 and the metal adhesive layer 22.

For the above LED structures, all of the reflective layers have a further function of adhesion and ohmic contact, therefore only metal material is suitable. A disadvantage of such material is that diffusion occurs at the interface of the metal layer and the LED epitaxial layer. Consequently, when a light source of 600 nm or more is applied, the lighting effect will be reduced since total reflection in the metal layer is not available. FIG. 3 shows the reflectivity varied with wavelengths, in which the reflectivity is 0.9 at 600 nm. Further, the reflectivity rapidly reduces at wavelength less than 600 nm, for example, 590 nm or 570 nm of yellow-green light. Consequently, the reflective layer cannot perform expected effect. Both the reflective metal layers as shown in FIGS. 1 and 2 exist such problem.

Therefore, it is desirable to provide an improved LED structure to promote the brightness, particularly at short wavelength.

SUMMARY OF THE INVENTION

An object of the present invention is to provide a high-brightness light emitting diode, which can exhibit superior lighting effect at long wavelength.

Another object of the present invention is to provide a high-brightness light emitting diode, which can exhibit much better lighting effect than the conventional at short wavelength.

In order to achieve the above object, the high-brightness light emitting diode includes a Si substrate, a first adhesive layer, a reflective layer, an LED epitaxial layer, a first-type ohmic contact electrode and a second-type ohmic contact electrode. The first adhesive layer is formed on the Si substrate. The reflective layer is formed on the first adhesive layer. The LED epitaxial layer is formed on the reflective layer and has a pn junction structure to form a first-type layer and a second-type layer adjacent to the reflective layer. The LED epitaxial layer also has a metal contact layer formed by partial surface of the second-type layer. The first-type ohmic contact electrode has the same type as the first-type layer and formed thereon. The second-type ohmic contact electrode has the same type as the second-type layer and formed on the metal contact layer.

The LED epitaxial layer can be a p-n structure or a n-p structure, or further include a p-type confining layer and an n-type confining layer. The first-type ohmic contact electrode can further include a transparent electrode thereon to enhance electric conduction. The reflective layer usually includes at least two materials, for example, a metal and an insulator, a high-dielectric material and a low-dielectric material, etc, wherein the insulator and the low-dielectric material are preferably adjacent to the LED epitaxial layer. The metal can be Al, Ag, Au, Pt, Pd, etc. The insulator can be $Al_2O_3$, $MgF_2$, $SiO_2$, $TiO_2$, $Si_3N_4$, etc. The high-dielectric material preferably has a refractive index larger than 2.1, and the low-dielectric material has a refractive index less than 1.56. The high-dielectric material can be $TiO_2$, $CeO_2$, Si, etc. The low-dielectric material can be $Al_2O_3$, $MgF_2$, $SiO_2$, $Si_3N_4$, etc. The reflective layer can further include a second adhesive layer therebelow to reinforce attachment with the first adhesive layer. The second and the second adhesive layers can be made from metal, for example, Au, Au/Be alloy, Au/Zn alloy, Pt, Pd, Cu, Ni, In and Al. The first adhesive layer also can be made from polymer nonconductor.

Other objects, advantages, and novel features of the invention will become more apparent from the following detailed description when taken in conjunction with the accompanying drawings.

DETAILED DESCRIPYION OF THE PREFERRED EMBODIMENTS

Figure 1:
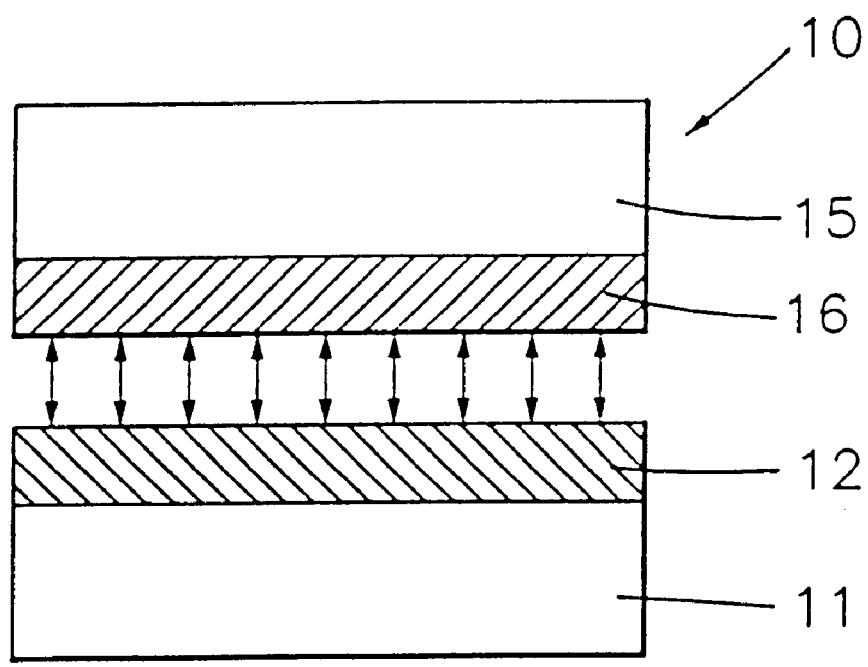
FIG. 1 shows the cross section view of a conventional LED.
Figure 2:
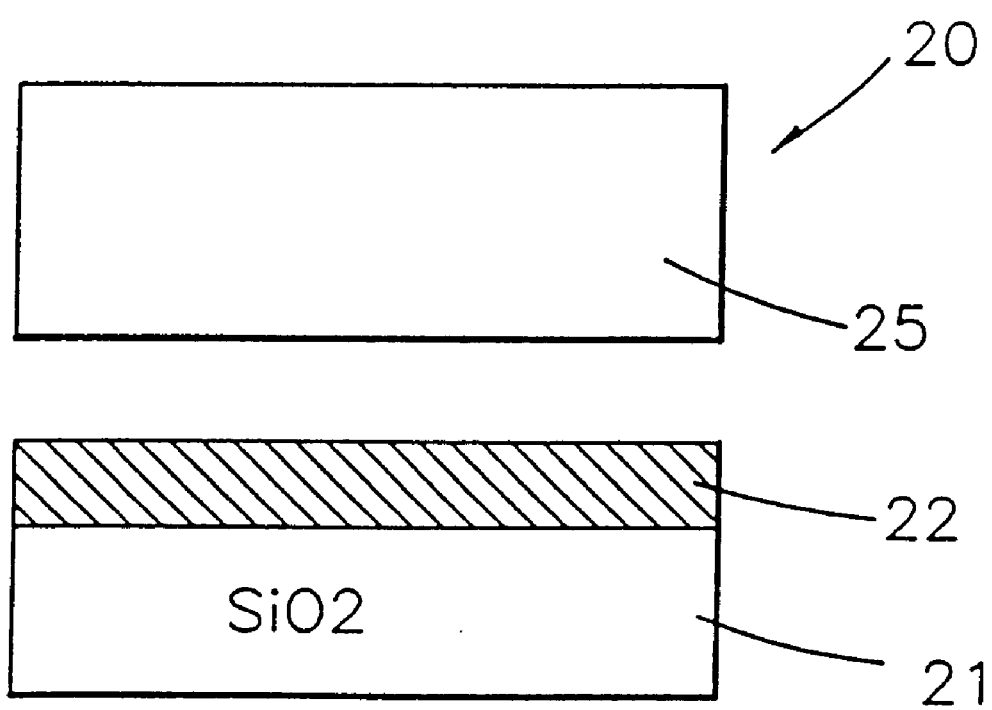
FIG. 2 shows the cross section view of another conventional LED.
Figure 3:
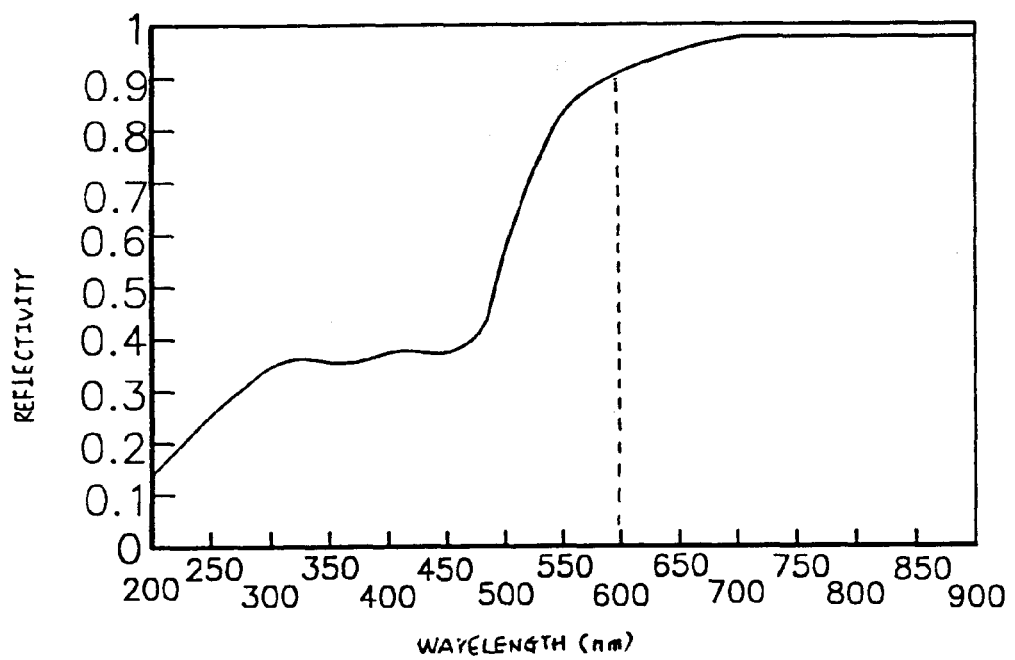
FIG. 3 shows the reflectivity varied with wavelengths.
Figure 4:
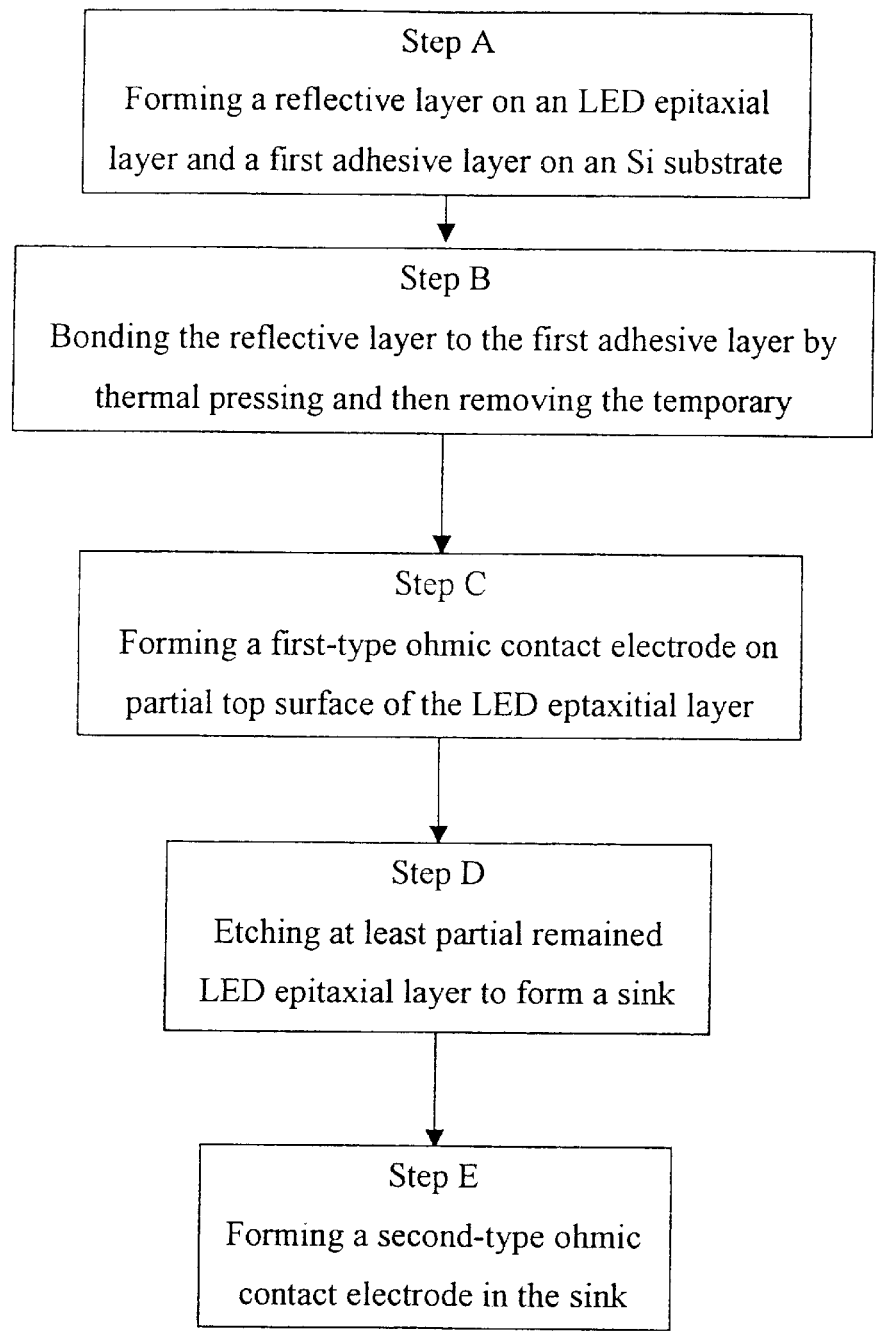
FIG. 4 shows the flow diagram for producing the LED in accordance with the present invention.

Referring to FIG. 4, the flow diagram for producing the high-brightness LED 50 of the present invention is shown. In step A, also with refer to FIG. 5, an Si substrate 51 having a first adhesive layer 52 and a LED epitaxial layer 55 having a nonconductive reflective layer 56 or a mirror layer formed on a bottom surface thereof are provided. The LED epitaxial layer 55 is an active structure and fabricated by II–VI or III–V alloys, for example, direct-bandgap LEDs, AlGaInP. The LED epitaxial layer 55 previously grows on a temporary GaAs substrate 59 and has a pn junction structure, wherein the upper one is a p-type layer 55A and the lower one is an n-type layer 55B. In this embodiment, the p-type layer 55A is arranged to be adjacent to the reflective layer 56 and the n-type layer 55B to the temporary substrate 59. The reflective layer 56 is a composite material including two materials. In this embodiment, the reflective layer 56 includes a metal 561 and a insulator 562, wherein the metal 561 is not provided for omhic contact, and the insulator 562 is adjacent to the LED epitaxial layer 55. The composite reflective layer 56 is not restricted, and can be $Al/Al_2O_3$, $Al/SiO_2$, $Al/MgF_2$, $Pt/Al_2O_3$, $Pt/SiO_2$, $Pt/MgF_2$, $Ag/Al_2O_3$, $Ag/SiO_2$, $Ag/MgF_2$, etc.

Figure 5:
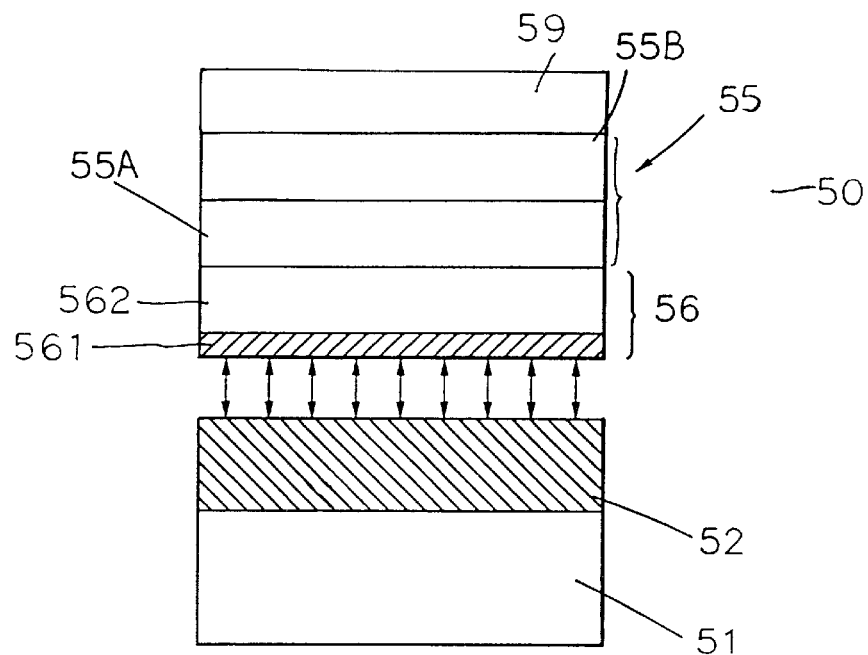
FIG. 5 shows the cross section view in the step of combining the LED epitaxial layer and the Si substrate of the present invention.

In step B, the LED eptaxitial layer 55 and the reflective layer 56 are bonded to the Si substrate 51 by thermal pressing, wherein the metal 561 is attached and adjacent to the first adhesive layer 52, as shown in FIG. 5. The temporary substrate 59 is then removed.

Figure 6:
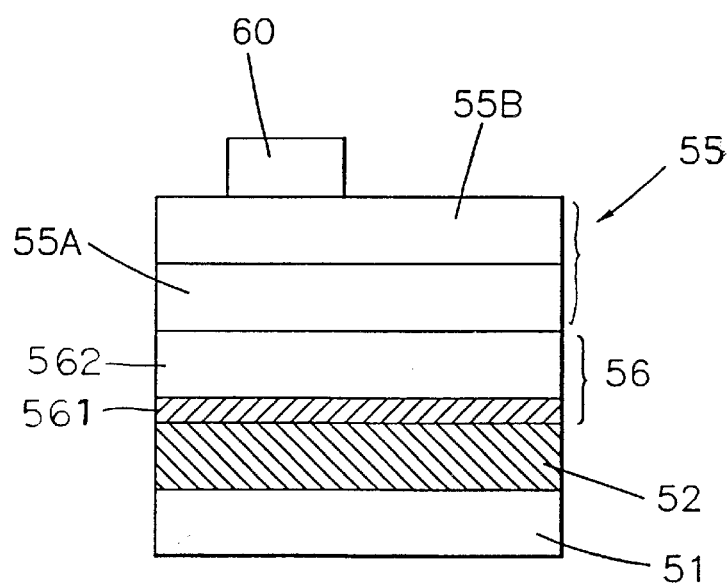
FIG. 6 shows the cross section view in the step of depositing the first-type ohmic contact electrode on the LED epitaxial layer of the present invention.

In step C, an n-type ohmic contact electrode 60 having the same type as the n-type layer 55B of the LED eptaxitial layer 55 is formed on the left top surface thereof by physical vapor deposition. FIG. 6 shows the cross section view of the structure developed in this step.

Figure 7:
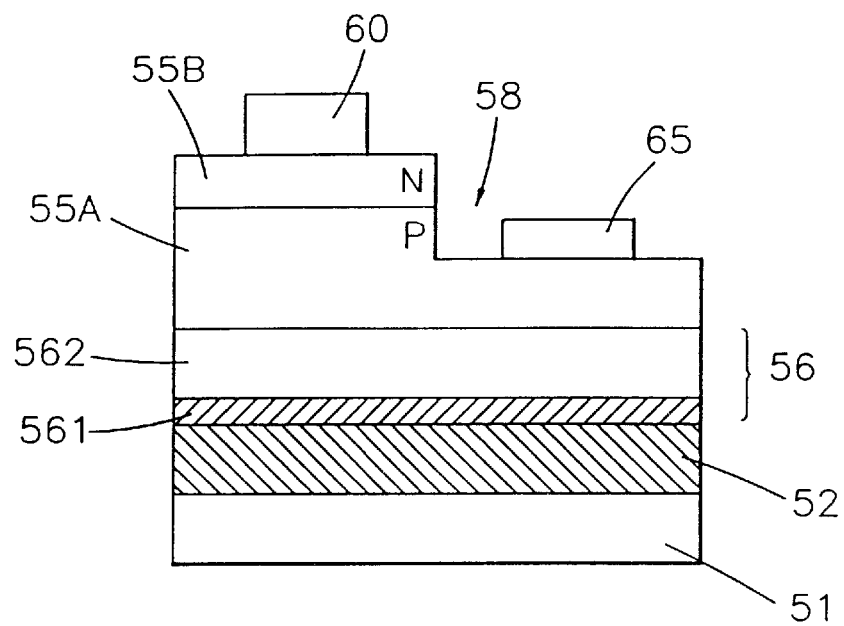
FIG. 7 shows the cross section view in the step of etching the LED epitaxial layer to form the metal contact layer and the second-type ohmic contact electrode of the present invention.

In step D, the right top surface of the LED epitaxial layer 55 is etched and stopped beneath the pn junction to form a metal contact layer 58 and expose the p-type layer 55A. In step E, a p-type ohmic contact electrode 65 having the same type as the p-type layer 55A of the exposed LED eptaxitial layer 55 is formed by physical vapor deposition. FIG. 7 shows the cross section view of the structure developed in these two steps. By supplying appropriate voltage to the ohmic contact electrodes 60, 65, the LED epitaxial layer 55 can be excited and emit light, wherein the backward light can be reflected by the reflective layer 56. Therefore, the light beams are all propagated frontward and the short-wavelength light would not be absorbed by the Si substrate 51, the brightness is hence promoted.

The LED eptaxitial layer in the present invention is not limited to the above form, and can alternatively has the p-type layer on the lower layer and the n-type layer on the upper layer, or further includes confining layers having the same types as adjacent layers on their surfaces respectively.

Figure 8:
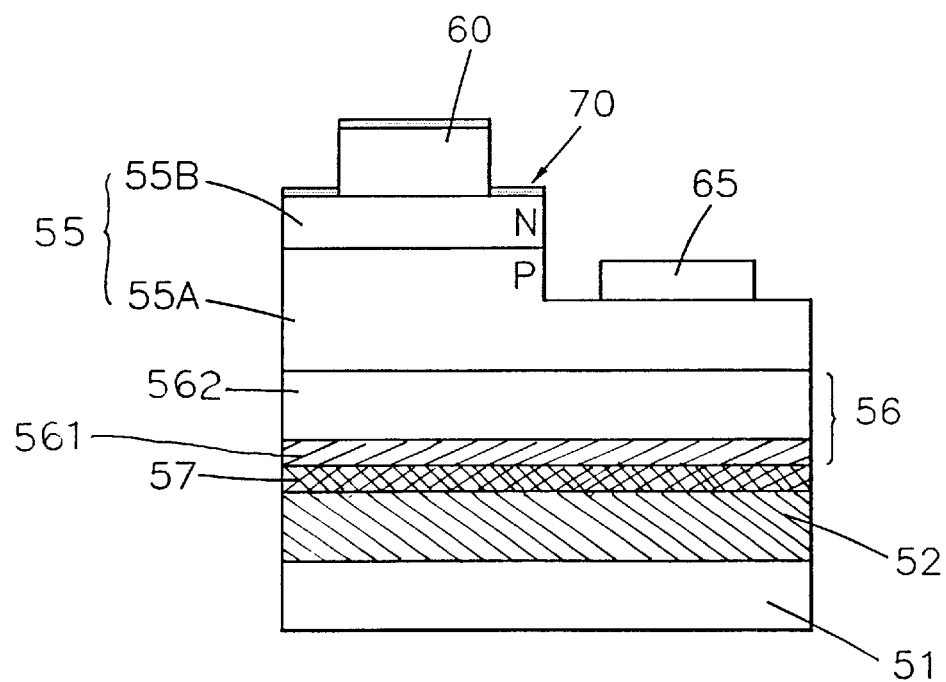
FIG. 8 shows the cross section view of the second embodiment in accordance with the present invention.

FIG. 8 shows the cross section view of the second embodiment in accordance with the present invention. In this embodiment, a transparent electrode 70 is applied on the n-type ohmic contact electrode 60 and the exposed n-type layer 55B of the LED epitaxial layer 55 to advance electric conduction. Additionally, a second adhesive layer 57 is applied below the reflective layer 56 to reinforce the attachment of the structures.

Figure 9:
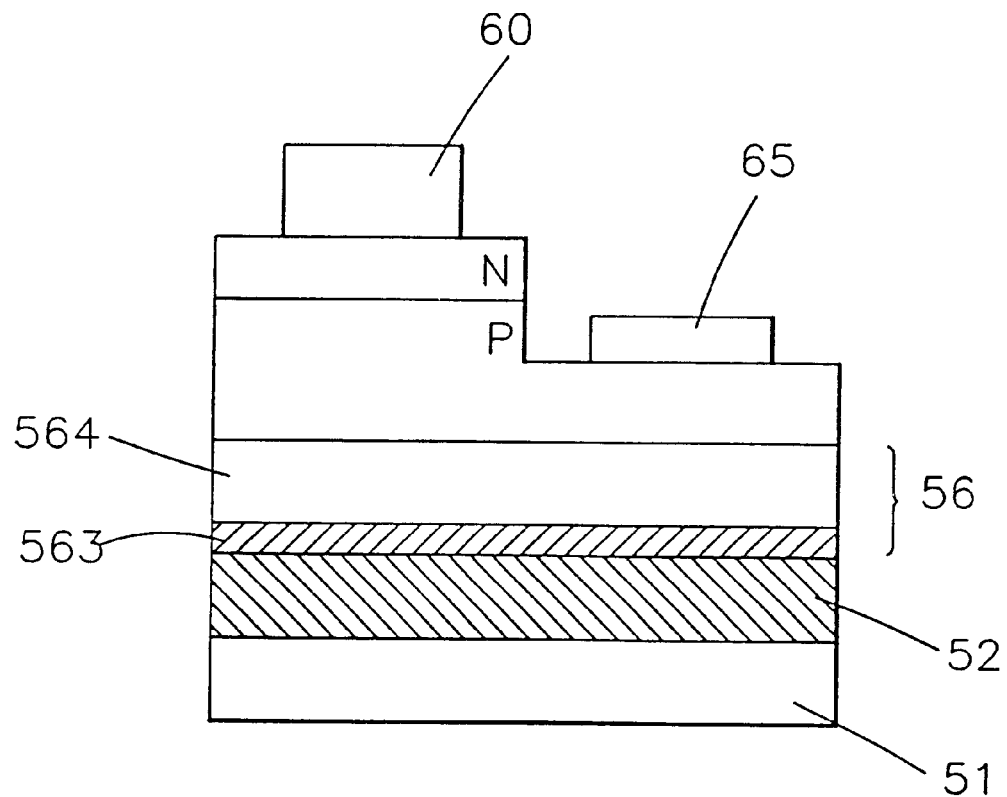
FIG. 9 shows the cross section view of the third embodiment in accordance with the present invention.

FIG. 9 shows the cross section view of the third embodiment in accordance with the present invention, in which the reflective layer 56 is composed of a high-dielectric material 563 and a low-dielectric material 564. The high-dielectric material 563 has a refractive index larger than 2.1, and the low-dielectric material 564 has a refractive index less than 1.56, for example, $(TiO_2/SiO_2)n$, $(Si/SiO_2)n$, $(Si/Si_3N_4)n$, wherein n is number of pairs. By means of properly arranging the layers of different refractive indices and thicknesses, high reflection of desired wavelengthes can be achieved.

In the present invention, the reflective layer 56, the first and second adhesive layers 52, 57 and the ohmic contact electrodes 60, 65 preferably perform single function, so that the most appropriate materials can be applied. For example, the first adhesive layer 52 and/or the second adhesive layer 57 can be a polymer nonconductor. Furthermore, reflectivity of the LED according to the present invention can be promoted above 98% at wavelength larger than 600 nm and above 90% at wavelength less than 600 nm.

Although the present invention has been explained in relation to its preferred embodiments, it is to be understood that many other possible modifications and variations can be made without departing from the spirit and scope of the invention as hereinafter claimed.

What is claimed is:

1. A high-brightness light emitting diode, comprising:
   an Si substrate;
   a first non-reflective adhesive layer formed on said Si substrate;
   a non-adhesive reflective layer formed on said first non-reflective adhesive layer and comprising a metal and a non-polymer insulator;
   an LED epitaxial layer formed on said non-adhesive reflective layer, having a pn junction structure to define a first-type layer and a second-type layer adjacent to said non-adhesive reflective layer, and having a metal contact layer formed by partial surface of said second-type layer;
   a first-type ohmic contact electrode formed on said first-type layer of said LED epitaxial layer; and
   a second-type ohmic contact electrode formed on said metal contact layer of said LED epitaxial layer.

2. The high-brightness light emitting diode as claimed in claim 1, wherein said LED epitaxial layer further comprises a p-type confining layer and an n-type confining layer.

3. The high-brightness light emitting diode as claimed in claim 1, wherein said first-type ohmic contact electrode further comprises a transparent electrode thereon.

4. The high-brightness light emitting diode as claimed in claim 1, wherein said non-polymer insulator is adjacent to said LED epitaxial layer.

5. The high-brightness light emitting diode as claimed in claim 1, wherein said metal is selected from the group consisting of Al, Ag, Au, Pt, Pd.

6. The high-brightness light emitting diode as claimed in claim 1, wherein said non-polymer insulator is selected from the group consisting of $Al_2O_3$, $MgF_2$, $SiO_2$, $TiO_2$ and $Si_3N_4$.

7. A high-brightness light emitting diode of non-blue color, comprising:
   an Si substrate;
   a first non-reflective adhesive layer formed on said Si substrate;
   a non-adhesive reflective layer formed on said first non-reflective adhesive layer and comprising a high-dielectric material and a low-dielectric material, wherein said high-dielectric material has a refractive index larger than 2.1, and said low-dielectric material has a refractive index less than 1.56, except for pairs of $TiO_2/SiO_2$, $ZrO_2/SiO_2$, $Ta_2O_5/SiO_2$, $HfO_2/SiO_2$;

an LED epitaxial layer formed on said reflective layer, having a pn junction structure to define a first-type layer and a second-type layer adjacent to said reflective layer, and having a metal contact layer formed by partial surface of said second-type layer;

a first-type ohmic contact electrode formed on said first-type layer of said LED epitaxial layer; and a second-type ohmic contact electrode formed on said metal contact layer of said LED epitaxial layer.

8. The high-brightness light emitting diode as claimed in claim 7, wherein said low-dielectric material is adjacent to said LED epitaxial layer.

9. The high-brightness light emitting diode as claimed in claim 7, wherein said high-dielectric material is selected from the group consisting of $TiO_2$, $CeO_2$ and Si.

10. The high-brightness light emitting diode as claimed in claim 7, wherein said low-dielectric material is selected from the group consisting of $Al_2O_3$, $MgF_2$, $SiO_2$ and $Si_3N_4$.

11. The high-brightness light emitting diode as claimed in claim 1 or 7, wherein said non-adhesive reflective layer further comprises a second non-reflective adhesive layer therebeneath to reinforce attachment with said first non-reflective adhesive layer.

12. The high-brightness light emitting diode as claimed in claim 11, wherein said second non-reflective adhesive layer is a metal.

13. The high-brightness light emitting diode as claimed in claim 12, wherein said metal is selected from the group consisting of Au, Au/Be alloy, Au/Zn alloy, Pt, Pd, Cu, Ni, In and Al.

14. The high-brightness light emitting diode as claimed in claim 1 or 7, wherein said first non-reflective adhesive layer is a metal.

15. The high-brightness light emitting diode as claimed in claim 1 or 7, wherein said first non-reflective adhesive layer is a polymer nonconductor.

* * * * *